United States Patent [19]

Samodovitz

[11] 4,443,733

[45] Apr. 17, 1984

[54] TAPERED WAVE TRANSDUCER

[76] Inventor: Arthur J. Samodovitz, 1860 Alder St. #30, Eugene, Oreg. 97403

[21] Appl. No.: 334,367

[22] Filed: Dec. 24, 1981

[51] Int. Cl.[3] .......... H01L 41/08

[52] U.S. Cl. .......... 310/369; 310/335; 310/365

[58] Field of Search .......... 310/322, 326, 335, 363-366, 310/369, 311, 334, 337, 327, 399, 339; 367/157, 162

[56] References Cited

U.S. PATENT DOCUMENTS

| | | | |
|---|---|---|---|
| 2,939,106 | 5/1960 | Mason | 310/369 |
| 2,956,184 | 10/1960 | Pollack | 310/369 |
| 3,382,381 | 5/1968 | Horton | 310/365 |
| 4,155,259 | 5/1979 | Engeler | 310/335 |
| 4,276,491 | 6/1981 | Daniel | 310/317 |
| 4,321,696 | 3/1982 | Kanda | 367/157 |

FOREIGN PATENT DOCUMENTS

| | | | |
|---|---|---|---|
| 2445805 | 8/1976 | Fed. Rep. of Germany | 310/339 |
| 52-60089 | 5/1977 | Japan | 310/369 |

*Primary Examiner*—J. D. Miller
*Assistant Examiner*—D. L. Rebsch

[57] ABSTRACT

The invention is a transducer which acts with an acoustical lens to produce a highly focussed beam and attenuated side lobe waves. The transducer comprises a resistive electrode which attentates electrical signals applied to and emanating from the peripheral region of the transducing element.

20 Claims, 5 Drawing Figures

TAPERED WAVE TRANSDUCER

BACKGROUND OF THE INVENTION

Transducers and acoustical lenses are commonly used for ultrasonic imaging. Standard transducers comprise a transducing element which is commonly made of a flat piezoelectric material and metallic electrodes on both sides. The lens is located in front of the transducer and is used to focus the mechanical waves produced by the transducer. To operate the transducer, an electrical signal is applied to the electrodes. In response, the transducing element produces mechanical waves. The mechanical waves travel through the lens, strike the object being imaged, and produce echoes. Some of these echoes return through the lens and strike the transducing element. In response to the mechanical waves, the transducing element produces an electrical signal on the electrodes. This electrical signal is used to generate an image.

The lens is used to focus the mechanical waves at a target in the object. To produce high resolution, the waves must be focussed to a narrow, concentrated beam. However, standard transducers produce uniform intensity, plane waves, and these waves, when focussed by a standard converging lens, produce "side lobes" in addition to the desired narrow beam or "main lobe". The intensity pattern is similar to a Bessel function waveform. These sidelobes indicate that mechanical waves are striking regions outside of the target, and thus, generating unwanted echoes. Some of these echoes proceed back to the transducer and are summed with those echoes produced by the main lobe mechanical waves. Standard imaging processors cannot distinguish the unwanted echoes from those of the main lobe. Thus, the echoes from the side lobes distort the image.

SUMMARY OF THE INVENTION

The invention is a transducer comprising a transducing element such as a piezoelectric disc, and electrodes. The electrodes can be made of a resistive material, or the electrodes can have an axial region made of a metallic, highly conducting material and a "washer-shaped" peripheral region made of a resistive material. The electrodes attach to two sides of the transducing element. A standard, converging, acoustical lens can be used to focus the mechanical waves produced by the transducer. The purpose of the resistive material in the electrodes is to attenuate electrical signals which are applied to and received by the peripheral region of the transducing element. This technique will attenuate the sidelobes of the transmitted beam and will accentuate the contribution of echoes originating from the region of the main lobe (focal zone).

DETAILED DESCRIPTION OF THE FIRST EMBODIMENT

Figure 1:
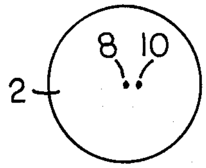
FIG. 1 is a top view of the first embodiment of the invention and shows a disc-shaped electrode and the tops of the wires that attach to each electrode.
Figure 2:
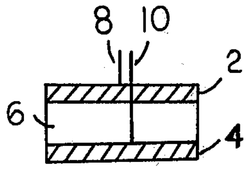
FIG. 2 is a cross-section of first embodiment of the invention, but not drawn to scale. The wire attaching to the bottom electrode fits through a hole in the transducing element and top electrode.

Standard electrodes for transducing elements are made of metal, usually gold or silver. The purpose of using metal is to provide high conductivity and thus, to allow the application of an almost equal electrical signal to all areas of the transducing element. The metal is usually sputtered onto the transducing element. The first embodiment of the invention is shown in FIGS. 1 and 2. The electrodes 2 and 4 are disc-shaped, and made of a resistive material. The resistive material may comprise carbon. It may be mixed into gold or silver or another metal, and sputtered onto the transducing element. The resistive material may comprise any other known resistive material, including naturally resistive metals or alloys. The resistive materials can be attached to the transducing elements 6 in any known manner. The transducing element can be of any standard variety including standard piezoelectrics.

Figure 3:
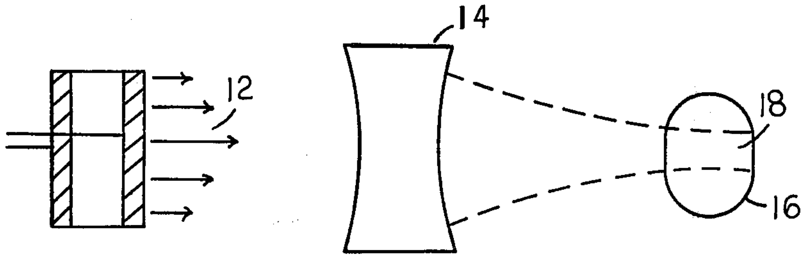
FIG. 3 shows the first embodiment transmitting mechanical waves through a converging, acoustical lens, and the acoustical beam of the main lobe. The transducer emits waves whose magnitude decreases with distance from the axis.

The transducer also comprises wires 8 and 10 attached near its axis. These wires bring the electrical signals to the electrodes. Since these wires attach near the axis of the electrodes, this region and the underlying region of the transducing element receive the largest electrical signals. Regions of the electrodes located away from the axis receive smaller electrical signals because some of the energy of those signals is dissipated in the resistive material of the electrodes. Thus, regions of the transducing element located away from the axis produce mechanical waves having less magnitude than the waves produced by the region about the axis. As a result, the magnitude of mechanical waves produced by the transducing element steadily decreases as the distance from the center increases, as shown by the length of the arrows 12 in FIG. 3. Note that the arrows are not drawn exactly to scale.

These "tapered" mechanical waves, when focussed by a converging 14 upon target 16, produce a beam with an intense center lobe 18 and attenuated side lobes.

The echoes which strike the transducing element produce electrical signals on the electrodes. The electrical signals located on the periphery travel toward the wires and thus, are attentated by the resistive material of the electrodes. All the signals sum at the wires. As a result, the signals generated by the axial region of the transducing element are accentuated and those from the periphery are attenuated. This causes the echoes originating from the region of the main lobe to be weighed more heavily than echoes originating from other regions. Thus, the resistive electrodes also act to attenuate the side lobes upon reception.

The electrodes should be thin so they will not interfere with the mechanical waves which are transmitted or received (echoes). For good results, the thickness of the electrodes should be less than the wavelength of the mechanical waves in the external medium.

The resistance of the electrodes is a function of the resistivity of the resistive material, and the thickness of the electrodes. The intensity pattern of main and side lobes is a function of the resistance of the electrodes, since the resistance of the electrodes determines the attenuation of the mechanical waves which are transmitted and received by the transducing element. The Bessel function can be used to calculate this intensity pattern. Since there is a trade-off between the tolerance for sidelobes and the desire for high resolution of the main lobe, and the needs of each imaging system vary, there is no one ideal electrical resistance for the electrodes which can be stated now.

DETAILED DESCRIPTION OF THE SECOND EMBODIMENT

The second embodiment is similar to the first except that the second embodiment has only one resistive electrode. The other electrode is standard and highly conductive.

DETAILED DESCRIPTION OF THE THIRD, "PREFERRED" EMBODIMENT

The third embodiment comprises standard, highly conductive electrode 20 and 21, such as gold or silver, around the axis of the electrode, and resistive, "washer-shaped" electrode 22 and 24 situated around the axial region. This washer-shaped region comprises the "peripheral" region of the electrode. In this patent application, "peripheral" refers to that region of the electrode or transducing element located outside of the axial region.

Figure 4:
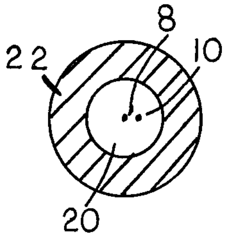
FIG. 4 is a top view of the third embodiment.
Figure 5:
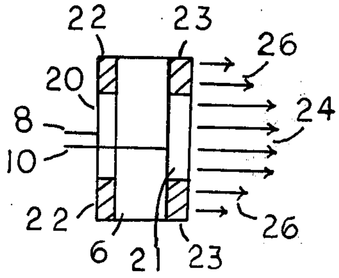
FIG. 5 shows a cross-section of the third embodiment and its transmitted mechanical waves. The length of the arrows roughly approximates the magnitude of the mechanical waves transmitted from the different regions.

In the third embodiment, the peripheral electrodes connects to the outer edge of the highly conducting or "axial" electrode. FIGS. 4 and 5 show both the axial and peripheral electrodes of the third embodiment. This transducer transmits mechanical waves 24 with uniform intensity from its axial region, and mechanical waves 26 with lower, "tapered" intensity from its peripheral region. As a result of its axial, conductive electrode, the third embodiment produces mechanical waves which have a more intense and narrow main lobe than that of the transducer of the first embodiment (at any one frequency).

A Gausian distribution of the magnitude of the mechanical waves versus the displacement from the axis will produce little sidelobes. A high and constant level of energy transmitted from the axial region, and decreasing energy transmitted from the peripheral region may better approximate a Gausian distribution than the distribution of the first embodiment—peak energy at the axis only, and decreasing energy from regions located further and further away from the axis.

DETAILED DESCRIPTION OF THE FOURTH EMBODIMENT

The fourth embodiment is similar to the third except only one electrode of the fourth embodiment has the axial and peripheral electrodes. The other electrode is a standard, highly conducting electrode.

DETAILED DESCRIPTION OF THE FIFTH EMBODIMENT

The fifth embodiment of the invention is similar to the third except only one electrode of the fifth embodiment has the axial and peripheral electrodes. The other electrode is a single, resistive electrode.

ALTERNATE EMBODIMENTS

The alternate embodiments of the invention comprise transducing elements and electrodes with similar electrical properties to those of the transducers previously described, but the shape of the alternate embodiments is different.

What is claimed is:

1. A transducer comprising:
a disc-shaped, piezoelectric transducing element, and
first and second electrodes attaching to opposite sides of the transducing element, the first electrode comprising a substantially washer-shaped, resistive region, and a highly-conductive region within the axial hole of said washer-shaped region.

2. The transducer of claim 1 wherein said highly-conductive region fills substantially all of the axial hole of said washer-shaped region.

3. The transducer of claim 2 wherein substantially all of said second electrode is highly-conductive.

4. The transducer of claim 3 wherein the inside diameter of said resistive region is at least twenty percent of the diameter of the transducing element, and the outer diameter of said resistive region is at least eighty percent of the diameter of the transducing element.

5. The transducer of claim 2 wherein the difference between the outer and inner diameters of said resistive region is at least ten percent of the diameter of said highly-conductive region.

6. The transducer of claim 2 wherein said first electrode is less in thickness than one third the wave length of acoustic waves which are transmitted and received by said transducer.

7. The transducer of claim 1 wherein substantially all of said second electrode is highly-conductive.

8. The transducer of claim 1 wherein the inside diameter of said resistive region is at least twenty percent of the diameter of the transducing element, the outer diameter of said resistive region is at least eighty percent of the diameter of the transducing element, and the difference between the outer and inner diameters of said resistive region is at least ten percent of the diameter of the transducing element.

9. The transducer of claim 1 further comprising means for applying a voltage to the axial, highly conductive portion of the first electrode.

10. A transducer comprising:
a disc-shaped, piezoelectric transducing element, and
first and second electrodes attaching to opposite sides of the transducing element, the first and second electrodes each having a substantially washer-shaped, resistive region, and a highly-conductive region filling substantially all of the axial hole of the respective, washer-shaped region.

11. The transducer of claim 10 wherein the difference between the outer and inner diameters of each resistive region is at least ten percent of the diameter of the respective, highly-conductive region.

12. The transducer of claim 10 wherein said first and second electrodes are less in thickness than one third the wavelength of acoustic waves which are transmitted and received by said transducer.

13. The transducer of claim 10 further comprising means for applying a voltage between the axial portions of the first and second electrodes.

14. A transducer comprising:
a disc-shaped, piezoelectric transducing element, and
first and second electrodes attaching to opposite sides of the transducing element, the first electrode having a resistive region which is disc-shaped and coaxial with the transducing element.

15. The transducer of claim 14 wherein said resistive region covers substantially all of one face of the transducing element.

16. The transducer of claim 14 wherein said second electrode is substantially the same as said first electrode.

17. The transducer of claim 15 wherein said second electrode covers substantially all of one face of the transducing element.

18. The transducer of claim 14 wherein said second electrode is highly-conductive.

19. The transducer of claim 14 wherein said first electrode is less in thickness than one third the wavelength of acoustic waves which are transmitted and received by said transducer.

20. The transducer of claim 14 further comprising means for applying a voltage to the axis of said first electrode.

* * * * *

UNITED STATES PATENT AND TRADEMARK OFFICE

CERTIFICATE OF CORRECTION

PATENT NO. : 4,443,733

DATED : April 17, 1984

INVENTOR(S) : Arthur J. Samodovitz

It is certified that error appears in the above-identified patent and that said Letters Patent is hereby corrected as shown below:

Column 2, line 47, after "converging" insert -- acoustical lens --.

Signed and Sealed this

*Fourth* Day of *December 1984*

[SEAL]

*Attest:*

GERALD J. MOSSINGHOFF

*Attesting Officer* *Commissioner of Patents and Trademarks*